United States Patent [19]
Hanson et al.

[11] Patent Number: 5,355,397
[45] Date of Patent: Oct. 11, 1994

[54] CLOCK START UP STABILIZATION FOR COMPUTER SYSTEMS

[75] Inventors: David A. Hanson, Altoona; Edward C. Priest, Eau Claire, both of Wis.

[73] Assignee: Cray Research, Inc., Chippewa Falls, Wis.

[21] Appl. No.: 950,628

[22] Filed: Sep. 24, 1992

[51] Int. Cl.⁵ .................. H03K 17/296; H03K 17/28; H03K 17/22

[52] U.S. Cl. ........................ 377/56; 377/20; 307/272.3; 307/269; 307/597; 307/603

[58] Field of Search ............... 377/20, 114, 56; 307/272.3, 296.3, 269, 592, 593, 595, 596, 597, 453, 470, 602, 603, 608

[56] References Cited

U.S. PATENT DOCUMENTS

| | | | |
|---|---|---|---|
| 3,035,187 | 5/1962 | Reichert | 377/114 |
| 3,725,793 | 4/1973 | Phillips | 307/269 |
| 4,218,590 | 8/1980 | Rasmussen et al. | 379/166 |
| 4,627,085 | 12/1986 | Yuen | 307/470 |
| 4,675,562 | 6/1987 | Herlein et al. | 307/602 |
| 4,937,504 | 6/1990 | Black et al. | 315/307 |
| 5,008,636 | 4/1991 | Markinson et al. | 331/2 |

*Primary Examiner*—John S. Heyman
*Attorney, Agent, or Firm*—Schwegman, Lundberg & Woessner

[57] ABSTRACT

Utilization circuits, such as logic chip circuits, are prevented from receiving the initial one or more pulses of a train of clock pulses produced after the master system clock is started, while the pulses of that train occurring thereafter are coupled to the utilization circuit. This prevents the skew usually present between the initial pulses of the train relative to the subsequent train pulses from adversely effecting operation of the utilization circuits. This clock swallowing preferably blocks a certain predetermined number of initial clock pulses from reaching the rest of the circuitry, although the system is adaptable to allow preselection of the number of such swallowed pulses.

4 Claims, 2 Drawing Sheets

CLOCK START UP STABILIZATION FOR COMPUTER SYSTEMS

BACKGROUND OF THE INVENTION

1. Field of the Invention

This invention relates to computers and data processing systems which include apparatus and methods for preventing skew between the initial pulses of a train of clock pulses from adversely effecting the operation of circuits dependent upon such clock pulses. The present invention is directed to apparatus and methods for introducing a train of clock pulses to functional circuitry with minimal or no skew between the pulses produced immediately after start up of a master clock or oscillator. More particularly, the present invention relates to methods and apparatus for removing skew from the initial sequence of clock pulses in a train of clock pulses generated by a master clock. This invention is especially useful in an environment of a computer system employing multiple processors which are concurrently operable and require close coordination of their data processing functions with each other.

2. Description of the Prior Art

Multiprocessor computer systems are dependent upon arrival of system clock pulses from a master clock at the utilization circuits with a minimum of variation in timing between pulses and with reliably consistent clock pulse quality. There are two forms of skew between clock pulses which create problems with the system operation. This includes skew between pulses within the train of clock pulses, and skew between the time of arrival of a given clock pulse at a plurality of utilization circuits. The present invention is primarily concerned with the former skew.

Whenever a system clock is first started, the initial pulses of the train it produces are skewed with respect to the subsequent pulses of the train the clock generates. For those initial pulses, the length and the period are far from that of the characteristic steady state clock pulse train which follow. This skew improves for each succeeding clock after the first pulse, or pulses, until steady state is reached. In the past, this problem was addressed either by never turning the clocks off, or by trying to account for the skew in the test results. The former suffers the disadvantage of a loss of testing capability, or flexibility, while the latter has proven marginally successful at best.

It is a well-known technique in the test of digital computer systems and test equipment to n-step through the system, or stop and start the master system clock to allow step by step analysis of performance. Such test circuits sometimes are arranged to start the system clock, and allow a single clock pulse to pass to the utilization circuitry. Thus, the test circuits are not affected by the fact that the first clock produced when the clock is turned on is usually badly skewed relative to the following pulses of the clock pulse train generated thereafter.

Various approaches have addressed the skew associated with pulses arriving at a plurality of utilization circuits. For instance, U.S. Pat. No. 4,675,562 by Herlein et al discusses a test system to aid in synchronizing and deskewing circuits by employing a series of delay circuits to apply predetermined delay to clock signals. It would not solve the problems associated with the skew associated with the initial clock start-up as described here, however, because when the delayed first clock arrives at a test point it is still skewed relative to its successor pulses.

U.S. Pat. No. 5,008,636 by Markinson et al employs a phase-locked loop on each board to maintain synchronization, and compensate for skew developing between clock pulses on different boards. It would not rid the system of the skew in the first few clock pulses generated, however.

No one has successfully resolved the problem of clock skew associated with a master clock, such as are used in computer systems when that clock is stopped and started.

SUMMARY OF THE INVENTION

Apparatus and methods in accordance with the present invention resolve the skew problem associated with the initially generated clock pulses by figuratively swallowing a predetermined number of the initial pulses from the clock. That is, the initial pulse, or pulses, are allowed to occur but it, or they, are prevented from reaching the intended operational circuit destination.

One embodiment for obtaining this result advantageously employs a counter circuit which has an output of zero for at least the first clock pulse, but preferably for a predetermined number of the initial pulses from the clock. This circuitry blocks the clock pulses until the counter circuit has an output of one. The utilization circuit, therefore, is actually receiving the second, or later pulse, of a train generated by the system master clock.

The method of preventing skew of an initial clock pulse of a train of clock pulses from a clock source from affecting functional operation of a utilization circuit begins with the steps of enabling the clock source to start production of a train of clock pulses. The pulses of the train produced by the clock source in response to the enabling step are at first blocked from reaching the utilization circuit. After counting a predetermined number of clock pulses from the clock source, the clock pulses are thereafter continuously coupled to the utilization circuit.

Apparatus in accordance with this invention is configured to prevent skew of an initial clock pulse of a train of clock pulses from a clock source from effecting functional operation of a utilization circuit such as a logic chip. The structure enables the clock source to begin producing a train of clock pulses at a terminal, but they are not connected to utilization circuit at the outset. Instead, a counter is coupled to the clock input terminal for receiving the pulses of the initiated train of pulses for producing an output signal in response to the reception of a predetermined number of those clock pulses from the clock source. Thereafter, a circuit element, such as an AND circuit, is actuated or enabled by the counter output signal for coupling or enabled by the counter output signal for coupling the pulse train to the utilization circuit.

Those having normal skill in the art will recognize the foregoing and other objects, features, advantages and applications of the present invention from the following more detailed description of the preferred embodiments as illustrated in the accompanying drawings.

DETAILED DESCRIPTION OF THE PREFERRED EMBODIMENTS

Figure 1:
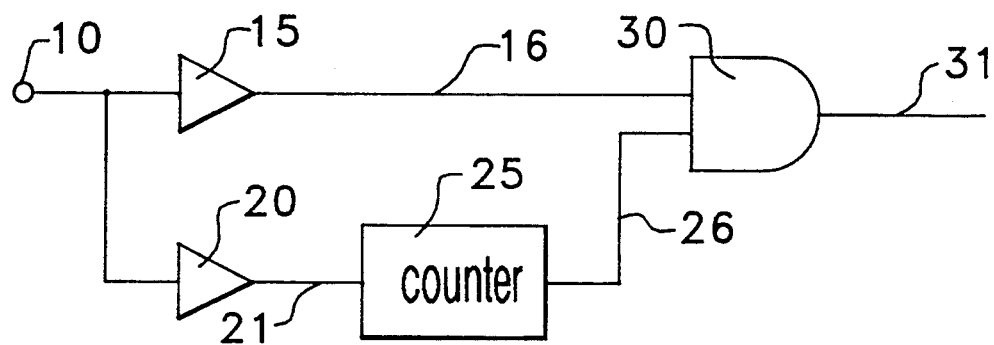
FIG. 1 is a block diagram of a clock pulse swallowing circuit of this invention.

FIG. 1 shows the preferred embodiment of the present invention operable in conjunction with a single clock system. A master oscillator (not shown) is actuated so as to begin producing a train of clock pulses which are introduced to input 10. These clock pulses pass through buffers 15 and 20 to condition the signal into outputs 16 and 21, respectively.

An n-bit counter 25 receives the signals at 21, and produces an output signal 26 of zero for the first predetermined number of clock pulses it sees at terminal 10. The output signal 26 becomes a one after that. N-bit counters of this type are conventional and commercially available. One example is the MC10E137, or MC100E137, high speed binary ripple counter marketed by Motorola.

Figure 4:
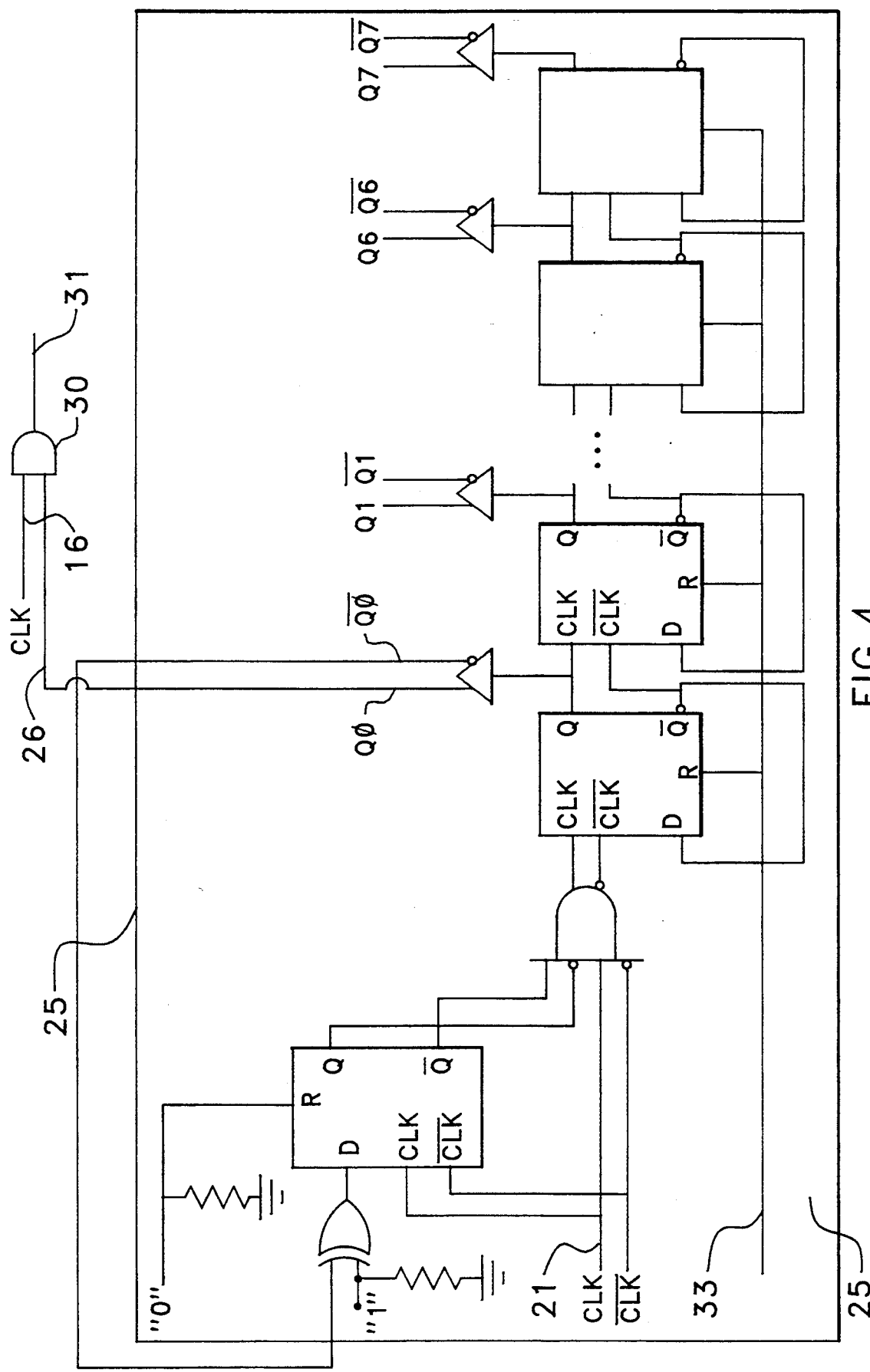
FIG. 4 is a typical counter circuit implementation for FIGS. 1 or 2.

An example of a typical counter 25 implementation along the lines of an MC10E137/MC100E137 Motorola module is shown in FIG. 4. By selecting the Q0 output count as the input 26 to AND gate 30, the first two clock pulses are blocked before the remainder of the pulse train is produced at output 31. Selection of Q2 results in swallowing the first four clock pulses, and so forth. When the master clock is turned off, a master reset signal is introduced to input 33 to reset counter 25 to an all zero state. Note that it is possible to include manual, or digitally settable, switches between line 26 and the various Q output signals of counter 25, thereby allowing dynamic selection of the number of initial clock pulses that are blocked.

Figure 3:
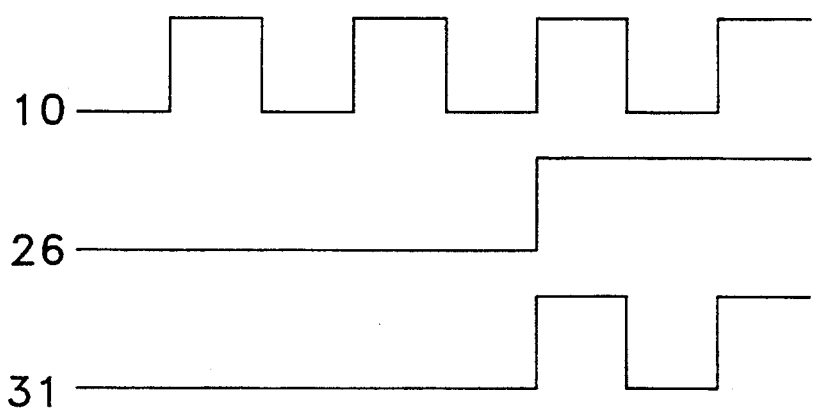
FIG. 3 is a timing diagram for FIG. 1.

Note that n-bit counter 25 can either count up to a preset number before enabling AND gate 30, or can dynamically respond to a digital input to allow the user to select the desired count dynamically. In the particular example illustrated in FIG. 3, it is assumed counter 25 requires two clock pulses to appear at input 10 before gate 30 is enabled. This correlates to Q1 selection in FIG. 4. Therefore, AND gate 30 will have a zero output for the first two clocks, as long as the output of counter 25 is zero. After two clock pulses occur, output 31 of AND 30 is the value of the clock input signals 10, since the other input to the AND gate 30 is now a constant one where it will remain until counter 26 is reset.

Figure 2:
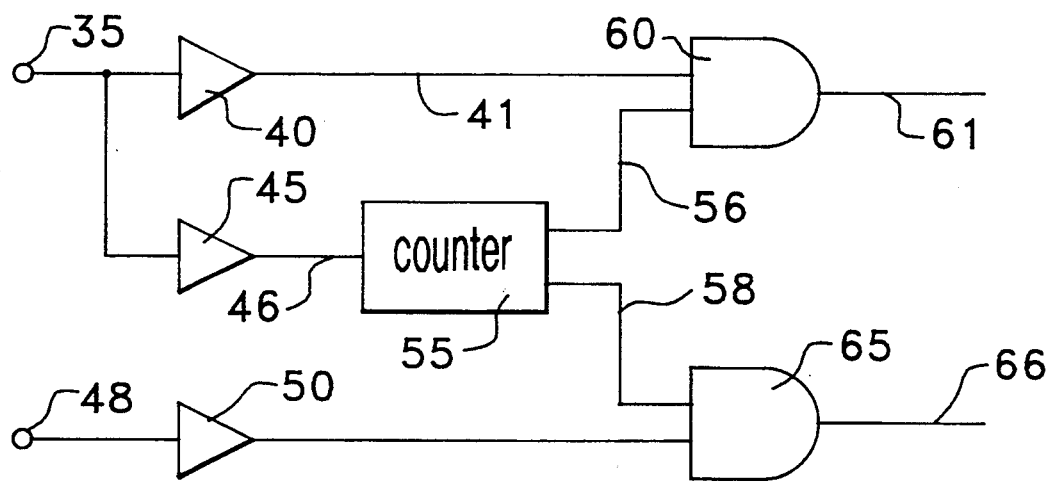
FIG. 2 is a diagram of a pulse swallowing circuit for a dual clock pulse system.

FIG. 2 shows an embodiment of the present invention suitable for use in a two clock system. Once again, the input at 35 is a train of pulses from a master system clock oscillator (not shown). These clock pulses pass through buffers 40 and 45 to generate signals at 41 and 46, respectively. The signal at 41 enters AND gate 60 but, as above, the output of AND gate 60 remains zero as long as the input from n-bit counter 55 remains zero.

The output 56 of n-bit counter 55 goes to a one level, and remains at that level after a first predetermined number of clock pulses appear at 46. Accordingly, the signal at output 61 of AND 60 is the first clock released to the utilization circuit. Similarly, the output of AND gate 65 remains zero until a later occurring output 58 from counter 55 goes to one. However, the other enabling input to AND gate 65 is a clock pulse signal from the same source as terminal 35 but delayed by some predetermined period of time before appearance at a second input terminal 48. Thus, the result is establishment of a second train of clock pulses which is thereafter produced at output 66.

Output 66 might represent the trigger output C1 of a classic clock system with output 61 representing the launch pulse C2. These clock pulses are then used as actuating signals into a utilization circuit, such as one or more standard latch pairs as is well known and conventional.

While the exemplary preferred embodiments of the present invention are described herein with particularity, those having normal skill in the art will recognize various changes, modifications, additions and applications other than those specifically mentioned herein without departing from the spirit of this invention.

What is claimed is:

1. A method of preventing skew of at least an initial clock pulse of a train of clock pulses from a clock source from effecting functional operation of a utilization circuit, the method comprising the steps of:

enabling the clock source to begin producing a train of clock pulses and a train of delayed clock pulses, blocking at least the first of the pulses of the train of clock pulses produced by the clock source from reaching the utilization circuit, blocking at least the first of the pulses of the train of delayed clock pulses produced by the clock source from reaching the utilization circuit.

counting a predetermined number of clock pulses from the clock source, and responding to the occurrence of said predetermined number of clock pulses pursuant to said counting step for coupling said clock pulses and said delayed clock pulses to the utilization circuit thereafter.

2. Apparatus for preventing skew of at least an initial clock pulse of a train of clock pulses from a clock source from effecting functional operation of a utilization circuit comprising:

means enabling said clock source to begin producing a train of clock pulses at a first terminal and a train of delayed clock pulses at a second terminal, counter memos coupled to said first terminal for receiving the pulses of said train of pulses for producing a first output signal in response to reception of a predetermined number of clock pulses from said clock source and a second output signal at a predetermined time subsequent to said first output signal, first means enabled by said counter means first output signal for coupling said first terminal clock pulses to the utilization circuit thereafter, and second means enabled by said second output signal for coupling said second terminal delayed clock pulses to the utilization circuit.

3. Apparatus in accordance with claim 2 wherein said counter means includes a plurality of stages the counting sequential clock pulses.

4. Apparatus in accordance with claim 3 wherein said counter means includes means for selecting the output of one of said plurality of stages for enabling said utilization circuit coupling means.

* * * * *

UNITED STATES PATENT AND TRADEMARK OFFICE
CERTIFICATE OF CORRECTION

PATENT NO. : 5,355,397

DATED : October 11, 1994

INVENTOR(S) : David A. Hanson et al.

It is certified that error appears in the above-indentified patent and that said Letters Patent is hereby corrected as shown below:

Column 4, Line 46, please delete "memos" and insert --means-- therefore.

Signed and Sealed this

Fifth Day of December, 1995

Attest:

BRUCE LEHMAN

Attesting Officer

Commissioner of Patents and Trademarks